United States Patent [19]

Kurihara et al.

[11] Patent Number: 4,919,074
[45] Date of Patent: Apr. 24, 1990

[54] APPARATUS FOR MOUNTING PARTS ONTO A PRINTED SUBSTRATE

[75] Inventors: Toshiyuki Kurihara; Benso Aomoto, both of Osaka; Ko Nishio, Oizumimachi, all of Japan

[73] Assignee: Sanyo Electric Co., Ltd., Osaka, Japan

[21] Appl. No.: 152,344

[22] Filed: Feb. 4, 1988

[30] Foreign Application Priority Data

Feb. 9, 1987 [JP] Japan .................. 62-27607
Aug. 28, 1987 [JP] Japan ................. 62-215768

[51] Int. Cl.$^5$ .......................................... B05C 11/00
[52] U.S. Cl. ................................. 118/697; 118/302; 118/313; 118/314; 118/315; 118/323; 118/324; 118/700; 427/208.2; 427/420; 427/422; 427/424
[58] Field of Search ............ 427/208.2, 422, 424, 427/420; 118/302, 313, 314, 315, 323, 324, 697, 700

[56] References Cited

U.S. PATENT DOCUMENTS

| | | | |
|---|---|---|---|
| 3,364,055 | 1/1968 | Nelson | 427/208.2 |
| 4,420,510 | 12/1983 | Kunkel et al. | 427/208.2 |
| 4,569,305 | 2/1986 | Ferri et al. | 118/211 |
| 4,584,964 | 4/1986 | Engel | 118/697 |
| 4,743,465 | 5/1988 | Saeki et al. | 118/302 X |

FOREIGN PATENT DOCUMENTS

2129776 11/1983 United Kingdom.

Primary Examiner—Bernard Pianalto
Attorney, Agent, or Firm—Darby & Darby

[57] ABSTRACT

The present invention discloses a method and apparatus for coating adhesive for mounting parts onto a printed substrate in which an adhesive coating nozzle is arranged in correspondence to the printed substrate placed on an X-Y table controlled to be moved in an X-Y direction, and said coating nozzle is operated to coat the adhesive within an adhesive storage tank in position on each of the printed substrates, at which a waste coating is carried out for said coating nozzle before the latter perform the coating operation with respect to the printed substrate, whereby even if the adhesive trickles from the end of the nozzle to bring forth the liquid-drip state, the adhesive in the liquid-drip state is eliminated by the waste coating of the coating nozzle to prevent the adhesive in the amount more than as needed from being coated on the printed substrate, thus always maintaining a stable amount of coating thereby positively preventing occurrence of irregularities in quantity.

18 Claims, 11 Drawing Sheets

| STEP | X-COORDINATE DATA | Y-COORDINATE DATA | ANGLE DATA | NOZZLE SELECT DATA | CONTROL COMMAND | |
|---|---|---|---|---|---|---|
| M1 | $x_1$ | $y_1$ | $z_1$ | 0 | | COATING DATA |
| M2 | $x_2$ | $y_2$ | $z_2$ | 0 | | |
| M3 | $x_3$ | $y_3$ | $z_3$ | 1 | | |
| ... | ... | ... | ... | ... | | |
| M100 | $x_{100}$ | $y_{100}$ | $z_{100}$ | 0 | P | |
| M101 | 0 | 0 | 0 | — | E | REPEATED PATTERN DATA |
| M102 | $x_1$ | 0 | 0 | — | | |
| M103 | $x_2$ | 0 | 0 | — | | |
| M104 | $x_3$ | $y_4$ | 0 | 0 | | LEAVING DATA |
| M105 | $x_4$ | $y_5$ | 0 | 1 | | |
| M106 | $x_5$ | $y_6$ | 0 | 0 | | |
| M107 | $x_6$ | $y_7$ | 0 | 1 | | |
| M108 | $x_7$ | $y_8$ | 0 | 0 | | |
| M109 | $x_8$ | $y_9$ | 0 | 1 | | |
| M110 | $x_9$ | $y_{10}$ | 0 | 0 | | |
| M111 | $x_{10}$ | $y_{11}$ | 0 | 1 | F | |

FIG. 7

```
              DEVICE TIMER              PAGE NO.1

1 WASTE DISPENSE TIMER-L1                 000
2                TIMER-L2                 000
3                TIMER-R1                 000
4                TIMER-R2                 000

------------------------------------------------
SELECT DATA & INPUT DATA
```

FIG. 8

```
          EMPTY NOZZLE NOTICE INFORMATION

EMPTY STOP FUNCTION                              1

DISPENSE NOZZLE-L1          *           1234
DISPENSE NOZZLE-L2                      1234
DISPENSE NOZZLE-R1          -           1234
DISPENSE NOZZLE-R2          -           1234
```

FIG. 9

```
                  EMPTY STOP DATA

EMPTY STOP FUNCTION                        0

UNTIL EMPTY TIMES L1                    1234
UNTIL EMPTY TIMES L2                    1234
UNTIL EMPTY TIMES R1                    1234
UNTIL EMPTY TIMES R2                    1234
```

| NOZZLE | (6) | (7) | (8) | (9) |
|---|---|---|---|---|
| | 1 | 0 | 1 | 0 |

APPARATUS FOR MOUNTING PARTS ONTO A PRINTED SUBSTRATE

BACKGROUND OF THE INVENTION (1) Field of the Invention

The present invention relates to a method of coating adhesive for mounting parts onto a printed substrate incorporated in an automatic mounting device for electronic parts and apparatus therefor, and more specifically, to a method of coating adhesive for mounting parts and apparatus therefor which can be applied to temporary mounting before final mounting by soldering in which chipped electronic parts (hereinafter referred to as chip part), for example, such as resistors, capacitors or transistors are positioned and mounted on a printed substrate.

(2) Prior Art

In the conventional automatic mounting device for electronic parts of this kind, a plurality of multiphase printed substrates are placed on an X-Y table controlled to be moved in an X-Y direction at fixed intervals, a plurality of adhesive coating nozzles corresponding to these printed substrates are arranged, said coating nozzles being selectively synchronized, adhesive within an adhesive storing tank is coated in position on each of the printed substrates before a chip part to be positioned and supplied by a part supplying device is mounted, and a chip part to be positioned and mounted on each of the printed substrates from the part supplying device is temporarily mounted.

In the existing circumstances, however, for the conventional coating devices for adhesive for mounting parts on the printed substrate, particularly for coating nozzles, large-diameter nozzles in which the amount of coating adhesive per coating operation is large and small-diameter nozzles in which the amount of coating adhesive is small are selectively used.

Therefore, in the above-described conventional coating apparatus, there poses no problem for the case of the coating nozzle which intermittently carry out the coating operation of adhesive to the printed substrate; but in the case of the other coating nozzles which are left unused for a long period of time, the adhesive within the storage tank trickles from the tip of the nozzle, which is a so-called "liquid-drip", and if in that state, coating operation of adhesive to the printed substrate is carried out, the adhesive in the amount more than as needed becomes coated on the printed substrate, which is prone to occurrence of unevenness in quality.

Also, a conventional coating nozzle has been proposed as disclosed in Japanese Patent Publication No. 61-56,638 Specification published in Japan, in which a projection is formed on a coating head, adhesive being supplied in advance from a storage tank is held on the end of the projection, and when the coating head is moved onto the printed substrate to carry out the coating operation, the adhesive held on the end of the projection is transferred between connection lands of the chip part on the printed substrate.

However, in such a coating nozzle as described above, both ends and a part of the side on the back side of the chip part may be held by adhesive but the central portion on the back side thereof cannot be held by adhesive because the adhesive is not coated thereon, whereby temporary mounting of the chip part not only becomes unstable but the adhesives are coated on the printed substrate in a spaced apart relation, and therefore if the coating amounts of adhesives are different from each other, mounting becomes unbalanced.

SUMMARY OF THE INVENTION

The present invention overcomes an inconvenience encountered in coating means of adhesive for mounting parts onto a printed substrate incorporated in the above-described automatic mounting device for electronic parts. It is an object of the present invention to provide an arrangement wherein an adhesive coating nozzle is arranged in correspondence to the printed substrate placed on an X-Y table control to be moved in an X-Y direction. The coating nozzle is operated to coat the adhesive within an adhesive storage tank in position on each of the printed substrates, at which a waste coating is carried out for said coating nozzle before the latter performs the coating operation with respect to the printed substrate. The if the adhesive trickles from the end of the nozzle to bring forth the liquid-drip state, the adhesive in the liquid-drip state is eliminated by the waste coating from the coating nozzle to prevent the adhesive in the amount more than is needed from being coated on the printed substrate. Thus, there is always maintained a stable amount of coating, thereby positively preventing occurrence of irregularities in quantity It is a further object of the present invention to provide an arrangement wherein a plurality of adhesive supply channels are provided in the coating nozzles, and these supply channels are communicated with each other at the head end through communication grooves. Thus, there is adhesive can be coated in the shape of approximately 8-letter on the printed substrate to adhesively hold both ends including the central portion on the back side of the chip part and a part of the side and the temporary mounting of the chip part can be maintained well balanced and in a stable state.

BRIEF DESCRIPTION OF THE DRAWINGS

FIG. 6 is an explanatory view showing NC program for deciding coating positions or the like;

DETAILED DESCRIPTION OF THE INVENTION

Detailed modes of the method of coating adhesive for mounting parts on a printed substrate and apparatus therefor according to the present invention will be described in detail hereinafter with reference to embodiments shown in FIGS. 1 through 22.

Figure 1:
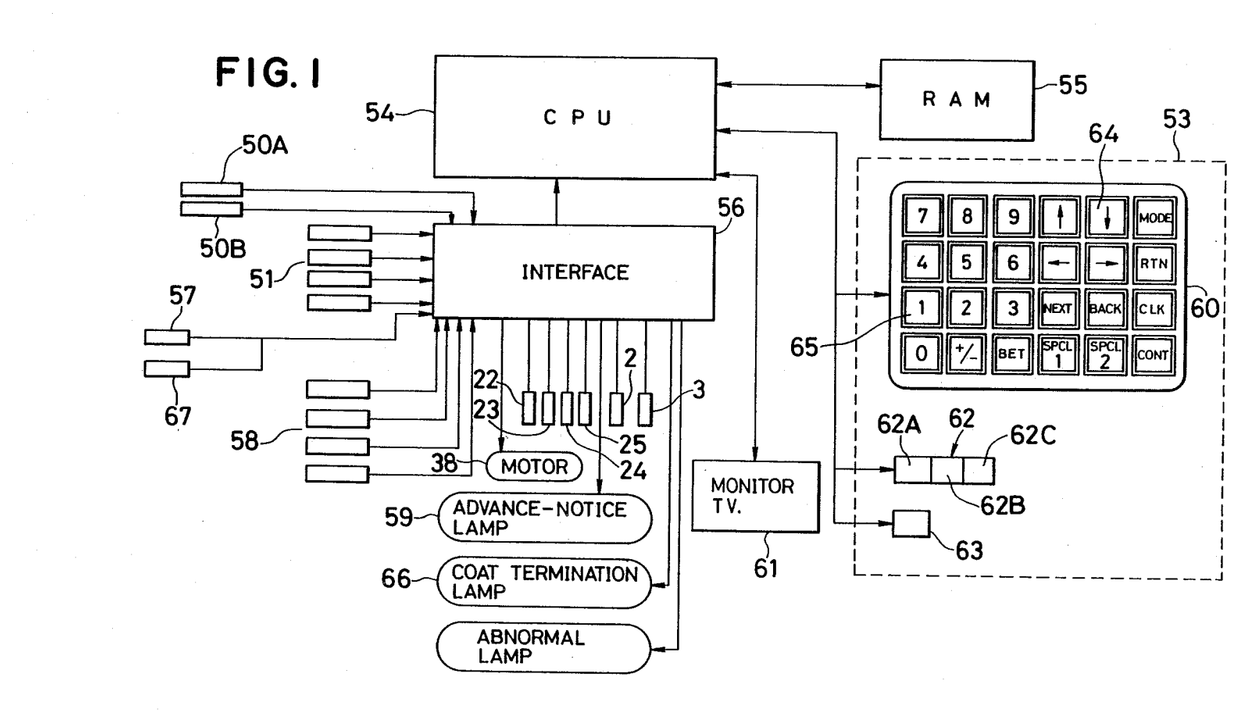
FIG. 1 is a control block diagram showing one embodiment of a method of coating adhesive for mounting parts on a printed substrate according to the present invention.
Figure 2:
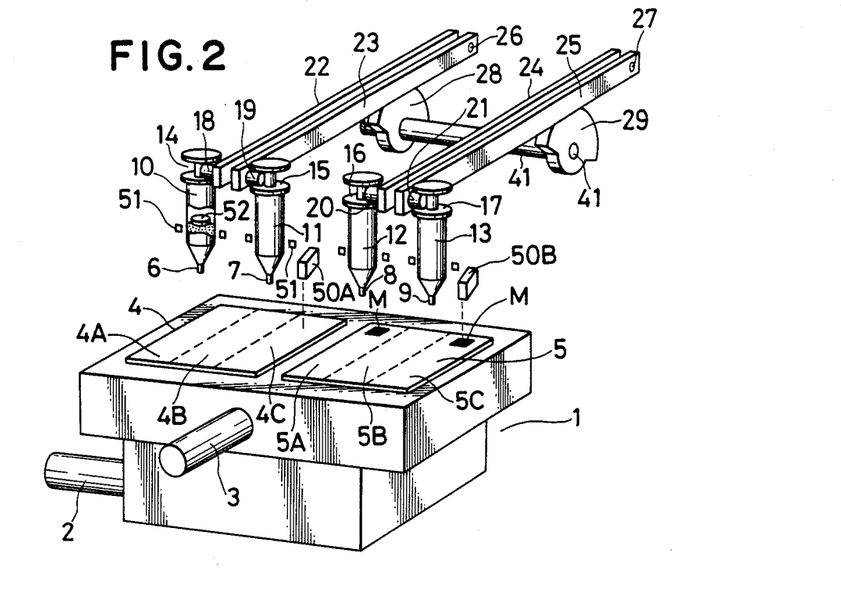
FIG. 2 is a perspective view showing a coating mechanism for adhesives.
Figure 3:
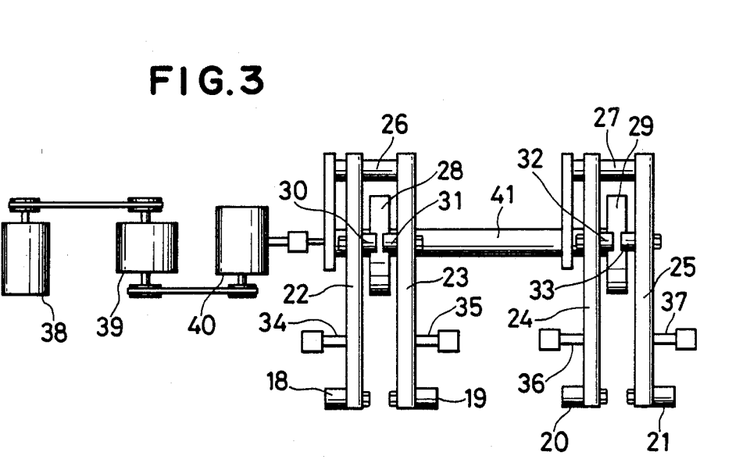
FIG. 3 is a plan view of the coating mechanism for adhesives.
Figure 4:
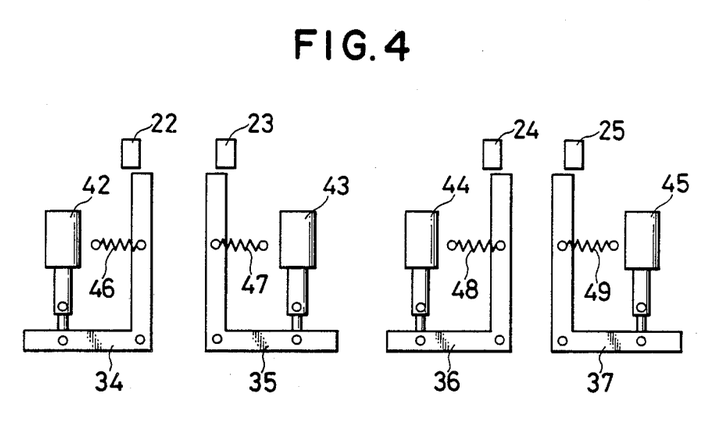
FIGS. 4 and 5 are explanatory views showing the operating state of a cam lever.

In the drawings, reference numeral 1 designates an XY table which can be moved by an X-direction drive motor 2 and a Y-direction drive motor 3 in X and Y directions, that is, in left, right, longitudinal and lateral directions, and on the table 1 are placed two multiphase printed substrates 4 and 5 at fixed intervals. Numerals 6, 7, 8 and 9 designate first, second, third and fourth coating nozzles, respectively, positioned upwardly of the XY table 1, the first and third nozzles 6 and 8 each being a small-diameter nozzle, the second and fourth nozzles each being a large-diameter nozzle. Numerals 10, 11, 12 and 13 designate tanks filled with adhesive as a coating agent, these tanks being supported by first, second, third and fourth cam levers 22, 23, 24 and 25 through roller receivers 14, 15, 16 and 17 and rollers 18, 19, 20 and 21. Numerals 26 and 27 designate fulcrum shafts provided on the other ends of the cam levers 22, 23, 24 and 25 and numerals 28 and 29 designate cams, respectively, whose diameter of an arc varies every circle, for example. One cam 28 holds first and second cam levers 22 and 23 through cam followers 30 and 31 whereas the other cam 29 holds the third and fourth cam levers 24 and 25 through cam followers 32 and 33. Stop levers 34, 35, 36 and 37 may be arranged in the intermediate position of the contact portion between the nozzle supporting portions of the cam levers 22, 23, 24 and 25 and the cams to individually and selectively hold the cam levers 22, 23, 24 and 25, respectively. Numeral 38 designates a motor which serves as a drive source for the cams 28 and 29, which motor imparts a turning force to a drive shaft 41 through a clutch brake unit 39 and a reduction gear 40.

Figure 5:
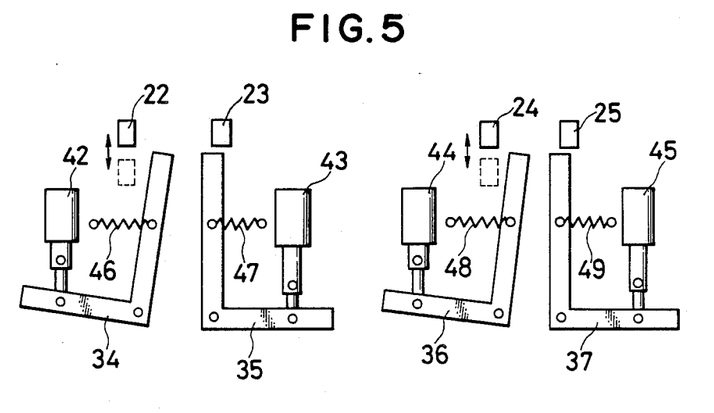

Upon rotation of the motor 38, the cams 28 and 29 rotate simultaneously, but in the case where all of solenoids 42, 43, 44 and 45 are not excited, all the stop levers 34, 35, 36 and 37 hold the cam levers 22, 23, 24 and 25 by the bias forces of springs 46, 47, 48 and 49. Where the first nozzle 6 and the third nozzle 8 are selected, the solenoids 42 and 44 are excited as shown in FIG. 5 so that holding of the first and third cam levers 22 and 24 by the stopper levers 34 and 36 is released against the springs 46 and 48, and the nozzles 6 and 8 are moved closer toward the printed substrates 4 and 5 at timing in which the small-diameter portions of the cams 28 and 29 are positioned at the cam followers 30 and 32 to supply adhesive. The changing of positions of the printed substrates 4 and 5 is carried out by moving the XY table horizontally when the nozzles 6, 7, 8 and 9 are raised upwardly by the large-diameter portions of the cams 28 and 29. At that time, by increasing pressure within the tanks 10, 11, 12 and 13, a supply of adhesive to the tips of the nozzles 6, 7, 8 and 9 and switching of the stopper levers 34, 35, 36 and 37 by the solenoids 42, 43, 44 and 45 may be carried out.

The printed substrates 4 and 5 have substrate portions 4A, 4B, 4C; 5A, 5B, 5C, which can be divided for each of the substrate portions, each substrate portion being coated with adhesive in the same pattern between connection areas so that chip parts may be placed and mounted thereon. Numerals 50A and 50B designate defective mark detection sensors, which detect defective marks M marked on the substrate portions 4A, 4B, 4C; 5A, 5B, 5C.

Numeral 51 designates an advance-notice sensor comprising a pair of permeation-type photoelectric switches, which detects that the residual amount of the adhesives in the tanks 10, 11, 12 and 13 reached a predetermined level. The advance-notice sensor 51 may be of a reflection-type proximity sensor, and a ring body made of stainless steel may be provided on the outer peripheral portion of a float 52 disposed within the tank for detection.

Numeral 53 designates an operating section which produces various data by operation of keys. The central processing unit, CPU 54, is provided to carry out predetermined controls in connection with setting of various data in response to the keys and controls in connection with adhesive coating work in accordance with various information. Random Access Memory, RAM 55, is provided to store set information by said operating section 53. Numeral 56 designates an interface, which is connected to the defective mark detection sensors 50A, 50B, a group of advance-notice sensors 51, a step counter 57, a group of timers 58, a motor 38, and an advance-notice lamp 59 and the like. The aforesaid operating section 53 comprises a keyboard 60 for setting various data, a picture plane selection key 62 for a monitor TV 61, and a start key 63 for initiating the adhesive coating operation.

Next, the operation for setting frequency of coatings so that after the advance notice of run-out of the residual amount of adhesive, the adhesive coating operation may be carried out through fixed frequency, will be described.

Figure 8:
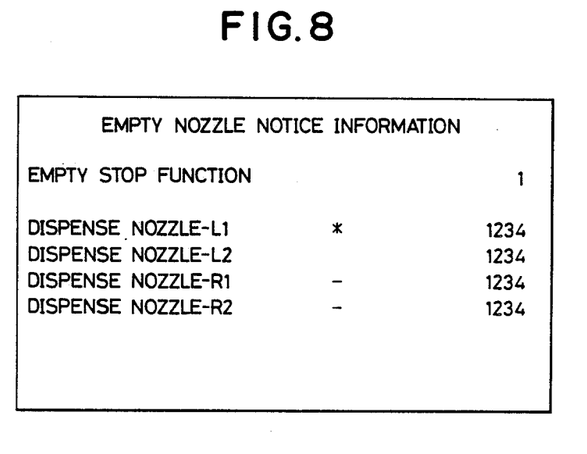
Figure 9:
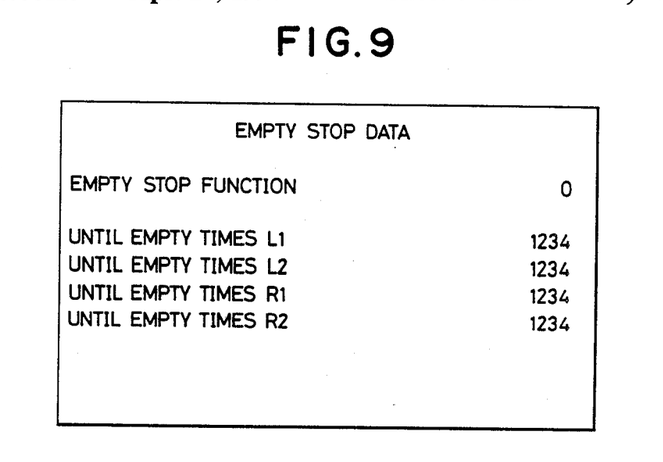
Figure 10:
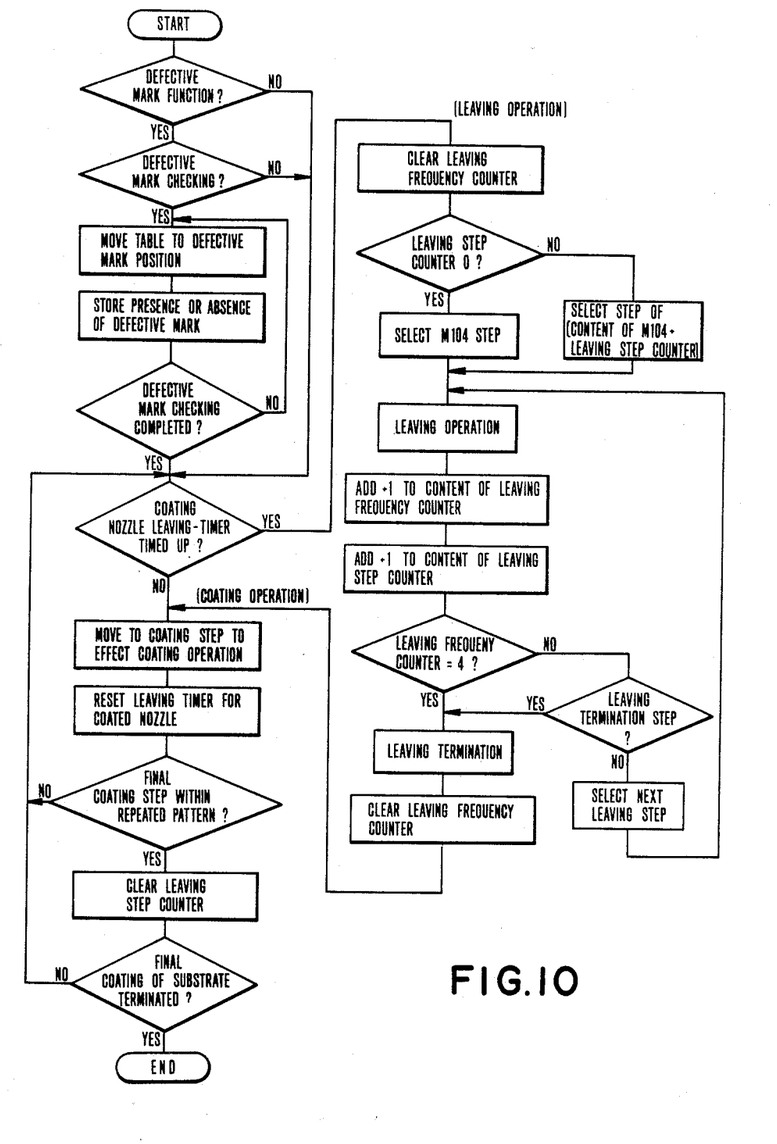
FIG. 10 is a flow chart showing the control state of the coating operation and leaving operation of the coating nozzles.
Figure 11:
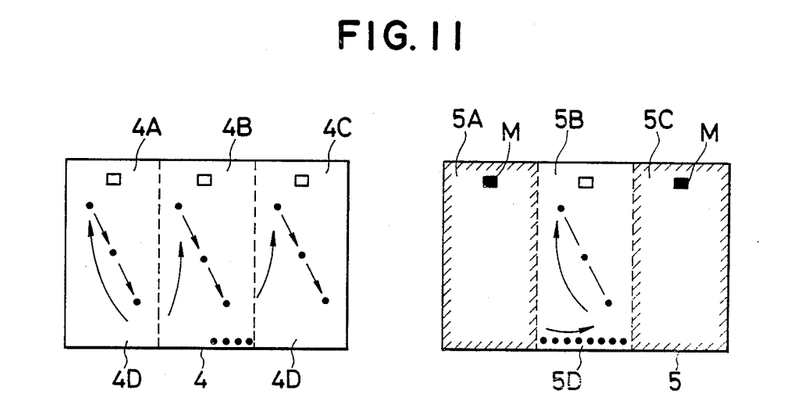
FIG. 11 is an explanatory view showing the state wherein adhesive is applied to a multiphase printed substrate.
Figure 12:
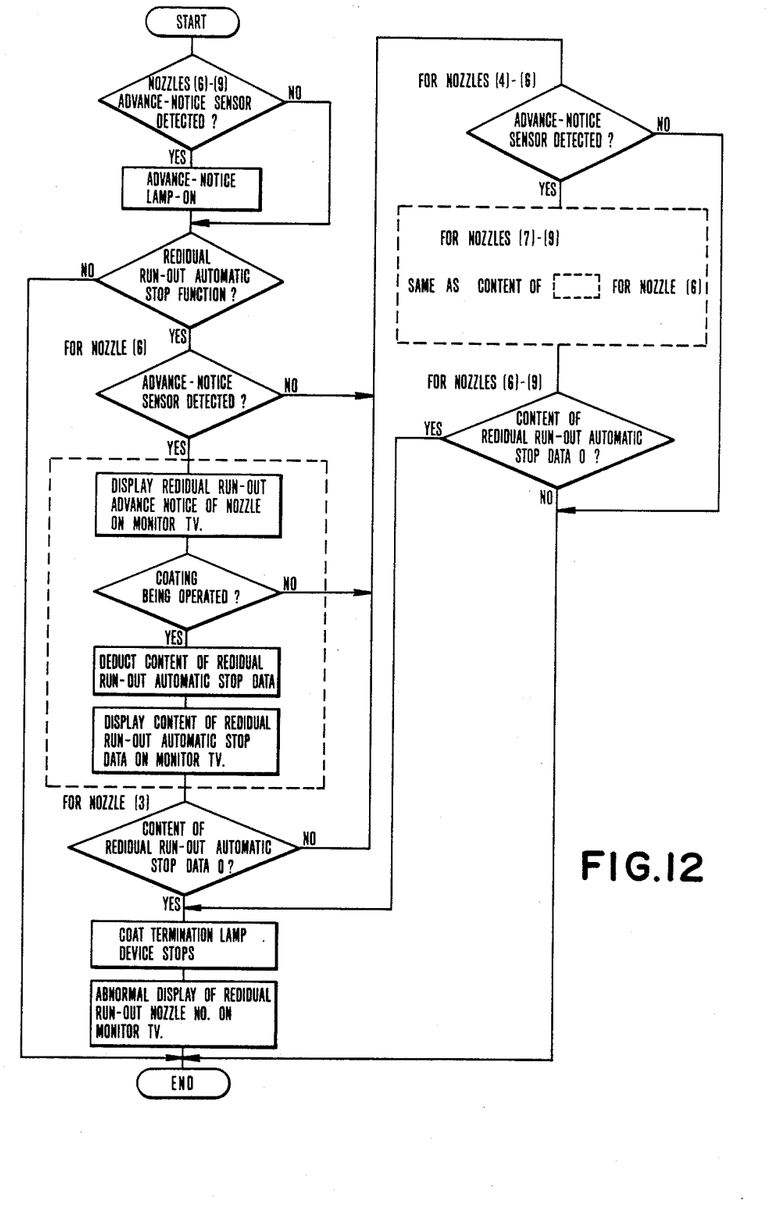
FIG. 12 is a flow chart showing a control state of automatic stopping operation by cutting off the residual amount of adhesives.

First, when selection key 62A is depressed, a picture plane as in FIG. 9 showing the data set mode appears. Then, a cursor not shown is moved, by using a cursor indication key 64 on the keyboard 60, to a "0" position indicative of function "NONE" of "EMPTY STOP FUNCTION" (automatic stop function after advance notice of run-out of the residual amount), and numeric key 65 of "1" is depressed to set FUNCTION "PRESENT". The thus set data is controlled so as to be written into a predetermined region of RAM 55 by CPU 54. Subsequently, in order that frequency of coatings of nozzles 6, 7, 8 and 9 may be set by said indication key 64, the nozzle is assigned and thereafter the frequency can be assigned by the voluntary numeric key 65. According to FIG. 8, each of the nozzles have been assigned so that the coating operation (1,234 times) may be carried out.

The aforesaid advance-notice lamp 59 is controlled so that when the advance-notice sensor 51 detects that the residual amount of the adhesive within the tanks 10, 11, 12 and 13 has reduced to a predetermined level, the lamp is turned on by CPU 54 through the interface 56. Numeral 66 designates a coating-termination lamp which is turned on when the coating through the preset frequency has been made.

While in the present embodiment, it is designed so that after the advance-sensor 51 has detected that the residual amount of the adhesive in the tanks 10, 11, 12 and 13 has reduced to a predetermined level, the coatings through selected frequency can be made, it is noted that operating time of the coating operation may be selectively set. In this case, unit of numerals set by the numeric key 65 is seconds.

The CPU 54 controls so that from the time when it receives an advance-notice signal from the advance-notice sensor 51 through the interface 56, it deducts one by one from the set frequency for every coating operation. It stores the content obtained after the deduction into a predetermined area of the RAM 55 and displays the content obtained after the deduction in the picture plane as shown in FIG. 8 by the operation of the selection key 62B on the monitor TV 61. When the content obtained after the deduction is "0", that is, when the coating operation through the set frequency is carried out, the motor 38 is deenergized and the coating-termination lamp 66 is turned on.

Figure 7:
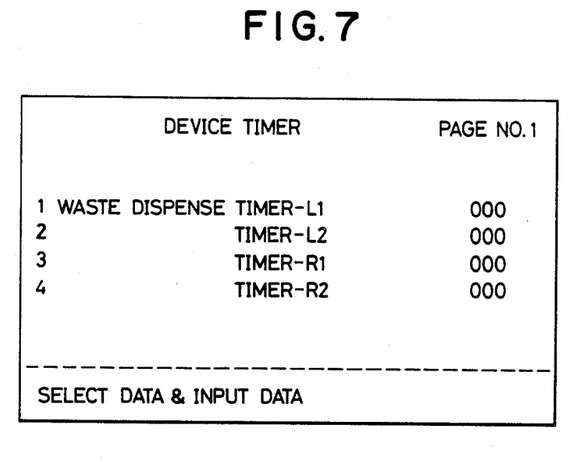
FIGS. 7 through 9 are explanatory views showing a picture plane of a monitor TV.

Next, the timers 58 will be described which are provided corresponding to the coating nozzles 6, 7, 8 and 9 to count non-use time of the nozzles. The timer time of each of the timers 58 can be individually and selectively set. Therefore, the setting method thereof will be described. First, the picture plane as shown in FIG. 7 is displayed on the monitor TV 61 by depression of the picture-plane selection key 62C of the operating section 53. Then, the cursor indication key 64 on the keyboard 60 is used, and the timer time of each timer 58 can be set in the range of 0 to 999 seconds by the numeric key 65.

Figure 6:
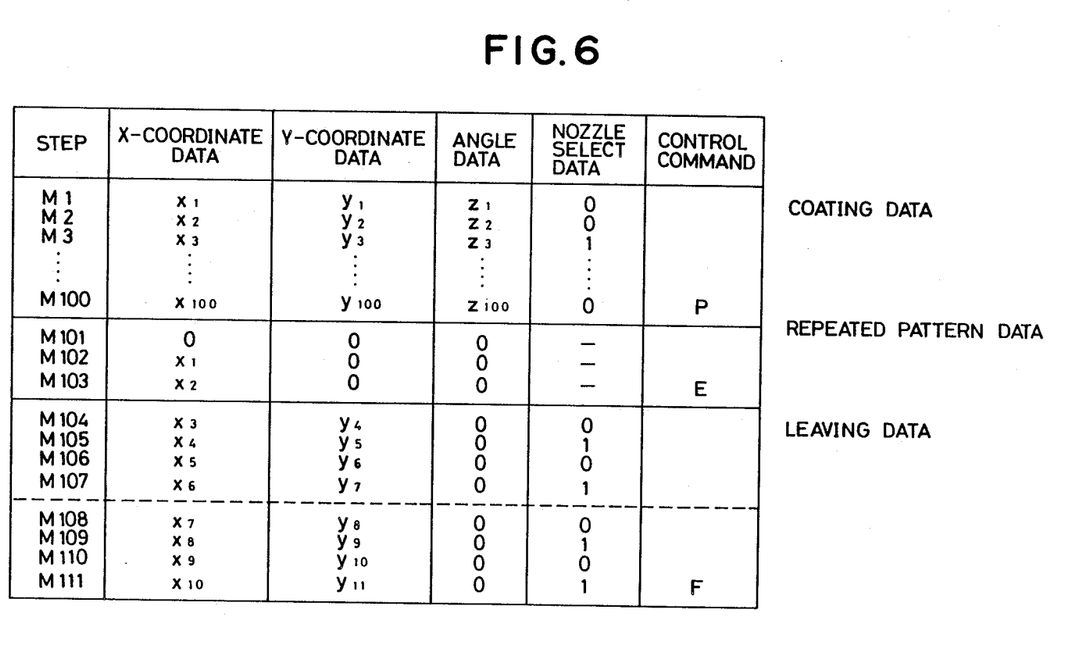

The timer time is set as just mentioned. This is because of the fact that when the non-use time is long, the adhesive trickles from each of the coating nozzles 6, 7, 8 and 9, and therefore when the timer time has passed. Marginal portions (4D and 5D) other than places at which electronic parts are placed are left to render the nozzle in the good condition, after which the intended adhesive coating may be effected. The method of setting the leaving data will be described. FIG. 6 shows the NC program for deciding the selection of the coating position, angles of the coating nozzles, and nozzles.

First, control command "P" shows the presence and absence of repetitive patterns. Steps M1 to M100 with "P" are data indicative of selection of the coating position of the first pattern, angles of the coating nozzles, and nozzles. Steps M101 to M103 to next command "E" are offset value of the pattern position with respect to the first pattern, and M101 to M103 indicate that there are three phases. That is, each of the multiphase substrates 4 and 5 each have three substrate portions 4A, 4B and 4C; 5A, 5B and 5C, respectively. Accordingly, the coating position of the first pattern has the coordinates, $(x1+0, y1+0)$, $(x2+0, y2+0)$ $(x3+0, y3+0)$ ..., $(x100+0, y100+0)$; that of the second pattern, $(x1+x1, y1+0)$, $(x2+x1, y2+0)$, $(x3+x1, y3+0)$ ..., $(x100+x1, y100+0)$; and that of the third pattern, $(x1+x2, y1+0)$, $(x2+x2, y2+0)$, $(x3+x2, y3+0)$ ..., $(x100+x2, y100+0)$. The "E" command indicates the termination of the program for deciding the coating position in normal coating operation and angles of the nozzles, and "F" command indicates the termination of the leaving data, which means that the leaving is effected at eight places at most. However, normally, each of the nozzles carry it out twice with respect to each of the substrate portions. The coordinate to be left with respect to the substrate portions 4A and 5A are $(x3+0, y4+0)$, $(x4+0, y5+0)$, $(x5+0, y6+0)$, $(x6+0, y7+0)$; that of 4B and 5B are $(x3+x1, y4+0)$, $(x4+x1, y5+0)$, $(x5+x1, y6+0)$, $(x6+x1, y7+0)$; and that of 4C and 5C are $(x3+x2, y4+0)$, $(x4+x2, y5+0)$, $(x5+x2, y6+0)$, $(x6+x2, y7+0)$. If the content of the nozzle selection data is "0", it means the small-diameter coating nozzles 6 and 8, and if the content is "1", it means the large-diameter coating nozzles 7 and 9.

When the leaving operation is carried out on the same leaving place of the substrates 4 and 5, the condition of the coating nozzles cannot be well maintained. In view of this, a leaving step counter 57 is stepped "1" by "1" for every leaving, after which the mode is shifted to the normal coating operation. However, when the time counted by timer 58 is up to where said coating operation is discontinued, the leaving is again carried out. If at that time, the content of the counter 57 is not "0", the step is shifted to Step M108 to effect leaving four times in other places which are not the same leaving place.

Numeral 67 designates a leaving frequency counter, which counts the frequency of leaving and is cleared when it counts four times.

With the above-described structure, the operation will be described hereinafter. First, when the start key 63 of the operating section 53 is depressed, CPU 54 carries out a predetermined operation in accordance with the program in connection with the adhesive coating operation. First, because of the provision of the defective mark detection function, the multiphase printed substrates 4 and 5 positioned on the XY table 1 are moved on the XY table 1 by the defective mark detection sensors 50A and 50B to detect the presence or absence of the defective mark M, and CPU 54 writes the detected content into a predetermined region of RAM 55. Then, first, the content detected by the defective mark detection sensors 50A and 50B of the leftmost substrate portions 4A and 5A of the substrates 4 and 5, respectively, is read by CPU 54 through RAM 55. If the defective mark M is marked on the substrate portion 5A, it is so controlled that even if the cams 28 and 29 are rotated by the motor 38, the solenoids 44 and 45 are not excited. Accordingly, the third and fourth cam levers 24 and 25 are not moved down by the stopper levers 36 and 37, and therefore the coating operation will not be carried out by the coating nozzles 12 and 13.

On the other hand, either solenoids 42 or 43 is excited on the substrate portion 4A not marked with the defective mark M whereby either stopper levers 34 and 35 may be rotated, and either cam levers 22 and 23 moves down. Accordingly, the adhesive is coated on the substrate portion 4A by either coating nozzles 6 and 7 according to the content of the nozzle selection data. At that time, the adhesive is coated on the substrate portion 4A at 100 places, and the coordinates of the coating position are $(x1+0, y1+0)$, $(x2+0, y2+0)$, $(x3+0, y3+0)$ ..., $(x100+0, y100+0)$.

Each of the timers 58 of course starts counting when the power source is closed but repeats its counting and setting till the final step of coating on the substrate portion 4A while resetting the timers 58 corresponding to the nozzles 6 and 7 after the coating operation has been carried out. At the final step, the leaving step counter 57 is cleared, and the counting and setting by the timers 58 corresponding to the nozzles 6 and 7 are repeated till the coating operation of the multiphase printed substrate 4 terminates.

On the other hand, since the defective mark M is not marked on the substrate plate 5A, the coating nozzles 8 and 9 will not effect the coating operation. Therefore, the timers 58 corresponding to these nozzles 8 and 9 are timed up. Accordingly, CPU 54 controls the motor 38, the solenoids 44 and 45, the X-direction drive motor 2 of the XY table and the Y-direction drive motor 3 so as not to be left by the marginal portion 5D of the substrate portion 5B before the normal coating operation is effected on the succeeding substrate portions 4B and 5B. If first, the leaving frequency counter 67 is cleared and the content of the leaving step counter 57 is "0", Step 104 is selected, and the solenoid 44 is excited because the content of the nozzle selection data is "0" and the coating nozzle 8 moves down and the XY table moves and then the adhesive is left on the coordinate (x3+0, y4+0). "1" is added to the contents of the leaving frequency counter 67 and leaving step counter 57. Since, the content of the leaving frequency counter 67 is not "4" and the step is not the leaving-termination step. Therefore next Step M105 is selected and the nozzle selection date is "1". Therefore the solenoid 45 is excited and the adhesive is left on the coordinate (x4+0, y5+0) by the nozzle 9. In this manner, the leaving by the alternate nozzles 8 and 9 are successively carried out four times in total, and then the leaving operation is terminated and the leaving frequency counter 67 is cleared.

Then, the step is shifted to the normal coating step to start the coating operation for the substrate portions 4B and 5B. It is of course that in accordance with the Steps M1 to M100, the nozzles 6 and 8, and 7 and 9 are synchronized to effect the coating operation for both the substrate portions 4B and 5B on the basis of the content of the nozzle selection data.

The case will be described in which the lock type start key 63 is depressed by the user, halfway through the coating operation for the substrate portions 4B and 5B, to stop the coating operation. At this time, each of the timers 58 is timed up, and if the start key 63 is again depressed, the coating operation starts but the leaving is again carried out. This needs to be carried out avoid places already left, which will be described hereinafter.

First, the leaving frequency counter 67 is cleared. Since the leaving step counter 57 has its content "4" as previously mentioned, Step M108, which is obtained by adding 4 to the step number 104, is selected to effect the leaving operation. Thus, since the nozzle selection data is "0", the solenoids 42 and 44 are excited to rotate the stopper levers 34 and 36 to move down the cam levers 22 and 24, and the leaving is carried out by the coating nozzles 6 and 8. At this time, the coordinate to be left is (x7+x1, y8+0), and the X-direction drive motor 2 and the Y-direction drive motor 3 are controlled to move the XY table 1. And, "1" is added to the contents of the leaving frequency counter 67 and leaving step counter 57, and then, the content of the counter 67 is "1" and the content of the counter 57 is "5". Since the content of the leaving frequency counter 67 is not "4", the next leaving step is selected and the step proceeds to Step M109. Since the nozzle selection data of Step M109 is "1", the solenoids 23 and 25 are excited and the leaving is carried out by the coating nozzles 7 and 9, the coordinate of which is (x8+x1, y9+0). In this manner, the step comes to Step M111, and the content of the leaving frequency counter 67 is then "4", terminating the leaving operation. The leaving frequency counter 67 is cleared, and the coating operation starts from the step next to the step in which the coating operation for the substrate portions 4B and 5B stops.

When the coating operation for the substrate portions 4B and 5B terminates as described above, the leaving step counter 57 is cleared, and the step proceeds to the next coating operation for the substrate portions 4C and 5C. Since the defective mark M is marked on this substrate portion 5C, the coating operation is not applied to the substrate portion 5C but to the substrate portion 4C alone, as previously described.

Then, the solenoids 42 and 43 are excited whereby the coating operation by the coating nozzles 6 and 7 is carried out with respect to the substrate portion 4C as previously mentioned. When the coating operation for the multiphase substrates 4 and 5 is terminated, said substrates 4 and 5 on the XY table 1 are fed downstream, the substrate (not shown) next to the upstream is placed on the XY table 1 to effect the coating operation in a manner similar to the above. At this time, the next multiphase substrate arrives to receive the coating operation. Here, the leaving as mentioned above is carried out before the coating operation is carried out with respect to the right-hand substrate.

In the case where the frequency of use of the small-diameter coating nozzles 6 and 8 is considerably different from that of the large-diameter coating nozzles 7 and 9, the timers 58 corresponding to the coating nozzles which are less in frequency of use are timed up even during the coating operation but also at this time the leaving operation is carried out. It is desired at this time that the leaving is carried out only for the coating nozzle corresponding to the timed up timer 58.

The coating operation is carried out as described above. In the following, the adhesive-residual run-out automatic stop function will be described. For example, when the advance-notice sensor 51 detects that the residual of the adhesive within the tank 10 shown in FIG. 2 reduced to a predetermined level, the CPU 54 which has received an advance-notice signal through the interface 56 controls so as to light the advance-notice lamp 59 if the former confirmed the presence of the residual run-out automatic function. At this time, the CPU 54 informs the user of the fact that said residual is in the predetermined amount by the advance notice lamp 59 and the monitor TV 61 on the monitor TV 61 as indicated by "*" on the line corresponding to the coating nozzle 6, as shown in FIG. 8.

Since the residual still remains, the coating can be carried out through the set frequency by the numeric key 65 on the keyboard 60. At this time, each one (1) is deducted every coating operation from the 1,234 times which are set frequency of the coating nozzle 6 as shown in FIG. 8. The content after such deduction is stored in the RAM 55 and is displayed on the monitor TV 61. When the coating operation is carried out through the set frequency after the advance-notice is made, as described above, the CPU 54 causes the motor 38 to be placed in non-energization state through the interface 56, after which the coating operation is not effected unless the tank 10 is replenished with adhesive to prevent a so-called coating operation without adhesive and light the coating-termination lamp 66 to inform the user of the effect.

Of course, the user may, during the advance notice, replenish the adhesive within the tank and may return it to the initial state by the operation of the key on the keyboard. That is, the user may replenish the adhesive during the time from the reception of the advance notice to the stoppage of the coating operation. Alternatively, after the replenishment of the adhesive, the user may depress the selection key 62A to make the picture plane of the monitor TV 61 as shown in FIG. 9, operate the CLR key on the keyboard to clear each of set frequencies to reset the set data.

In such a coating apparatus, when any one of the leaving timers is timed up, both the small and large diameter coating nozzles become involved in the leaving operation, and therefore there is an inconvenience in that even the nozzle which requires no leaving becomes involved in leaving.

To cope with this, in case where the start key 63 is operated to re-start the coating operation, in case where the using nozzle is switched after one-side nozzle out of the large and small nozzles during the coating operation, and in case where the coating operation is re-started from the substrate portion marked with a bad mark to the substrate portion not marked with a bad mark, there is considered to make the processing possible for the case where any one of the leaving timers of the nozzles is timed up.

Figure 13:
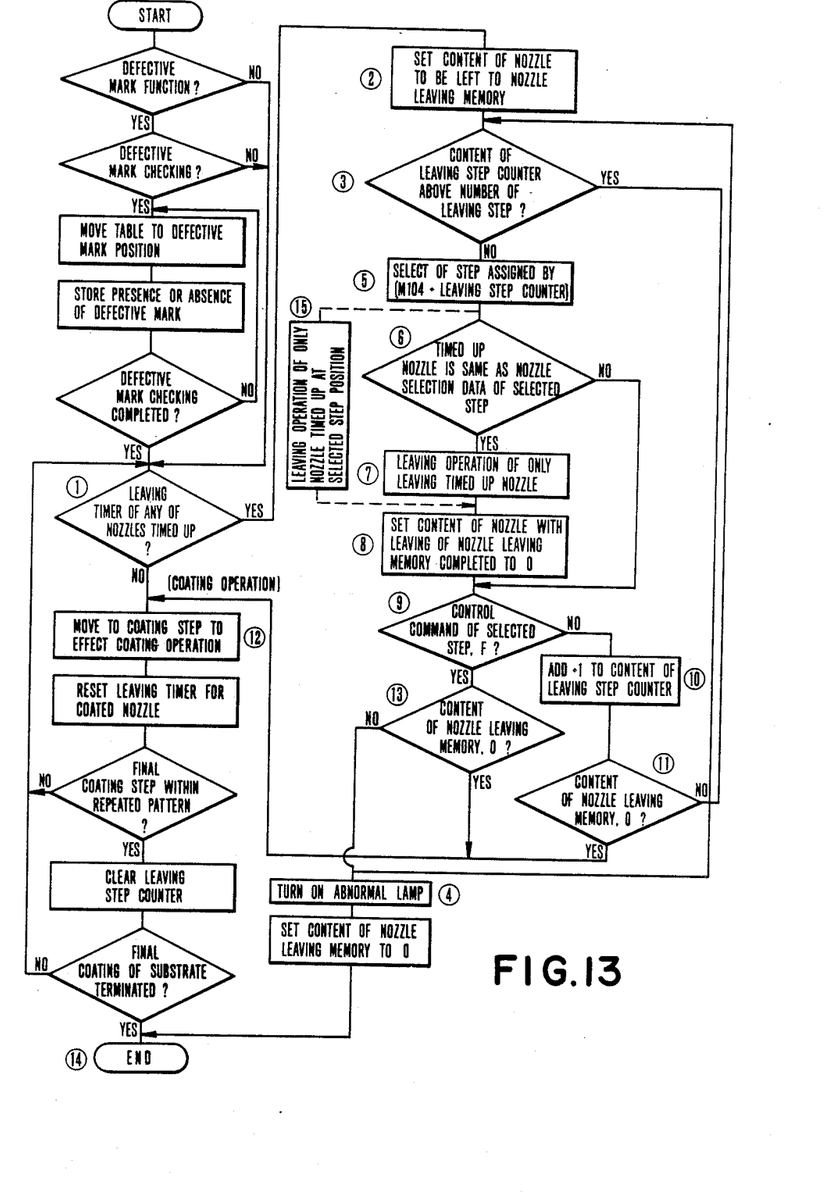
FIG. 13 is a flow chart showing a control state of another embodiment according to the present invention.
Figure 14:
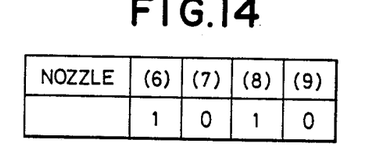
FIG. 14 is an explanatory view of a memory region for the leaving operation of the coating nozzles.

Such a structure will be described in conjunction with a flow chart of FIG. 13. In the case of the above-mentioned three conditions, the CPU 54 detects which timer out of the leaving timers 58, 58, 58 and 58 corresponding to the nozzles 6, 7, 8 and 9 times up ( 1 ) and sets, when it timed up, the nozzle to be left to the nozzle leaving memory region of the RAM 55 ( 2 ). More specifically, the nozzle leaving memory region is designed to that "0" and "1" are set corresponding to the nozzles 6, 7, 8 and 9 as shown in FIG. 14. For example, if the timers 58 and 58 of the nozzles 6 and 8 are timed up, "1" is set to the aforesaid region.

Next, the CPU determines whether the content of the leaving step counter 57 is more than the number of leaving steps ( 3 ), and if the content is more than the number of leaving steps, turns on the abnormal lamp 67 ( 4 ) to stop the coating operation, if the content of the leaving step counter 57 does not reach the number of leaving steps, the step of the address wherein the content of the leaving step counter 57 is added to the leading address M104 of the leaving step is selected ( 5 ). For example, if the content of the leaving step counter 57 is "2", the step of address M106 is selected.

Subsequently, the CPU determines whether the nozzle associated with the leaving timer 58 being timed up coincides with the nozzle selected by the nozzle selection data of the selected step ( 6 ). In the case where they coincide, only for the leaving timed up nozzle, the leaving is carried out in the coordinate position assigned by the X-coordinate and Y-coordinate data ( 7 ), and the content of the leaving memory region within the RAM 55 is set to "0" ( 8 ). On the other hand, in the case where the timed up nozzle is not coincided with the nozzle selected by the nozzle selection data, the aforementioned operations ( 7 ) and ( 8 ) are skipped.

Thereafter, determination is made as to whether a control command of the selected leaving step is F ( 9 ). If it is not F, 1 is added to the content of the leaving step counter 57 ( 10 ), and determination is made whether the content of the nozzle leaving memory is "0" ( 11 ). If said content is 0 the step is returned to the coating operation ( 12 ), and if it is not "0", the step is returned to the step of ( 3 ). In case where in the step of ( 9 ), the control command is F, a determination is made whether the content of the nozzle leaving memory is "0" ( 13 ) , and if it is"0", the step is returned to the coating operation ( 12 ). If it is not "0", the abnormal lamp 67 is lighted ( 4 ) to stop the operation ( 14 ).

While in the above-described operation, the leaving positions are made to be separated according to the large or small nozzles, it is to be noted that for example, instead of the steps of ( 5 ) and ( 7 ) the leaving operation of the nozzle timed up in the selected position is carried out ( 15 ) despite the size (large or small) of the nozzle assigned by the nozzle selection data.

Figure 15:
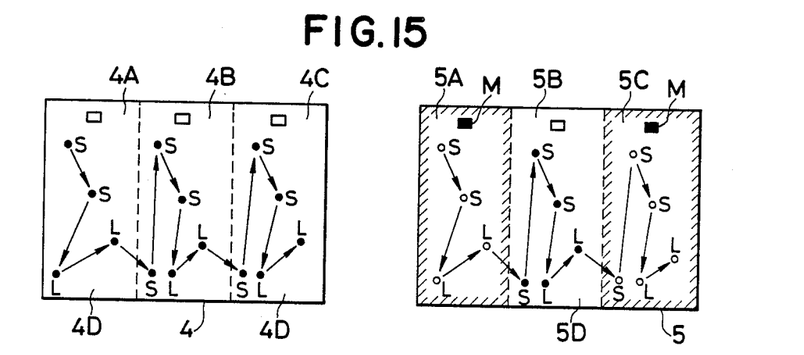
FIG. 15 is an explanatory view showing another embodiment of adhesive coating operation.

In such an apparatus, when the multiphase substrates 4 and 5 having the respective three substrate portions 4A, 4B and 4C; and 5A, 5B and 5C are likewise coated, reference is made to FIG. 15, in which the black circle indicates the point where the coating operation is effected, and the while circle indicates the point where the nozzle is moved to that position but the coating operation is not effected. In the adhesive coating operation for the substrate portions 4A, 4B, 4C, 5A, 5B and 5C, the small-diameter nozzles are first used and then switched to the large-diameter nozzles halfway through use. It is assumed that the substrate portions 5A and 5C have the bad marks M and M.

Figure 16:
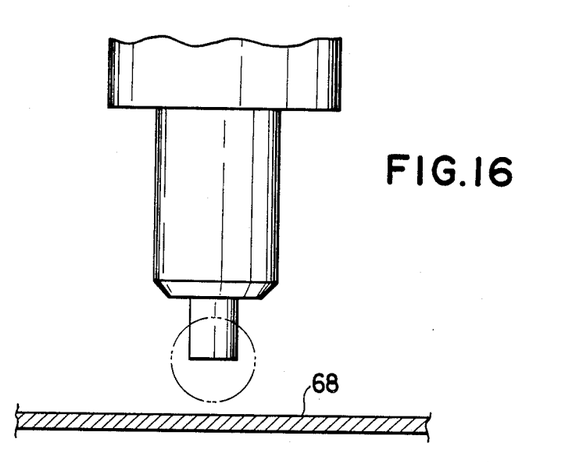
FIG. 16 is a side view of a coating nozzle.
Figure 17:
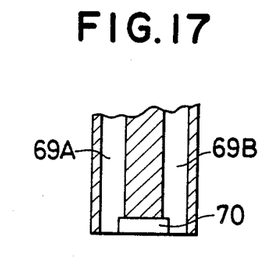
FIG. 17 is a longitudinal sectional side view of a small-diameter nozzle.
Figure 18:
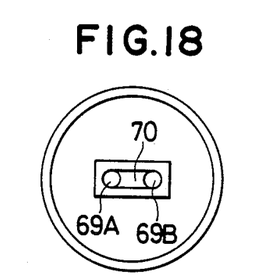
FIG. 18 is a bottom view of a small-diameter nozzle.

FIG. 16 is an enlarged view of a coating nozzle portion, FIG. 17 is a side sectional view of a nozzle tip, and FIG. 18 is a view of a nozzle tip as viewed from the lower surface thereof, which is the case of small-diameter nozzles for small parts used in the above-described first and third nozzles 6 and 8. Reference numeral 68 designates a substrate. This nozzle is formed with a plurality of adhesive supply channels 69A and 69B through which adhesive passes while being fed under pressure for a fixed period of time by high pressure air, and is formed with a communication groove 70 which brings openings at lower ends of the supply passages 69A and 69B into communication with each other, the groove having its lower surface opened.

Figure 19:
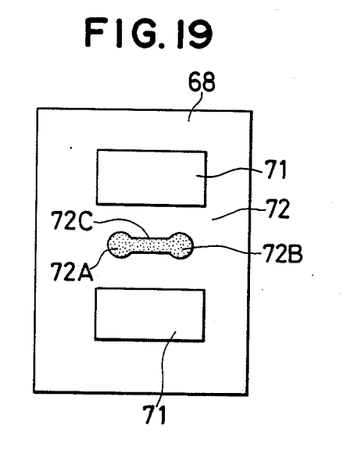
FIG. 19 is an explanatory view showing the coating form of adhesive on the printed substrate.
Figure 20:
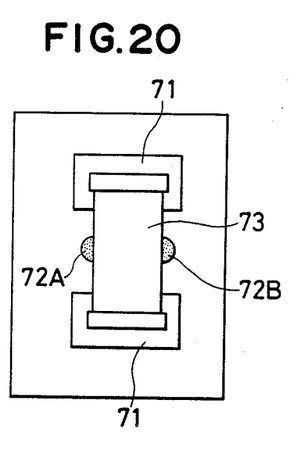
FIG. 20 is an explanatory view showing a temporary mounting state in which an electronic part is adhesively held on the printed substrate.
Figure 21:
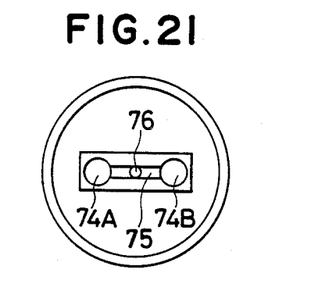
FIG. 21 is a bottom view of a large-diameter nozzle.
Figure 22:
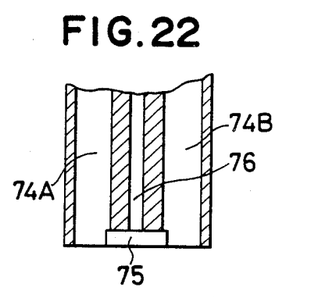
FIG. 22 is a longitudinal sectional side view of a large-diameter nozzle.

Accordingly, when the adhesive is fed under pressure through the supply passage 69A and 69B, the adhesive is held on the tip of the coating nozzle 2 by surface tension and adhesion. The thus held adhesive is pressed in position between connection lands 71 and 71 on a wiring substrate 68 so that the former is transferred onto the substrate 68 to form an approximately 8-letter adhesive 72 as shown in FIG. 19. Therefore, an electronic part 73 has its opposite ends in the form of an electrode, as shown in FIG. 20, and the bottom surface of the part 73 and a part of the side thereof are adhered and held by the adhesive 72 so that the electrode may be positively coupled to the connection lands 71 and 71. That is, since the adhesive 72 is formed with circular portions 72A and 72B and a bridge portion 72C which bridges therebetween, the side of the electronic part 73 is adhered and held by the circular portions 72A and 72B of the adhesive 72, and the bottom surface of the part 73 is mainly adhered and held by the bridge portion 72C. Thus, the adhesive 72 is coated laterally lengthwise so that portions forced out of the opposite sides of the electronic part 73 are continuously connected, and adhered and held in a well balanced stable condition. The adhesive 72 used is of the ultraviolet or thermosetting, and it can be set before application of soldering.

Next, the large-diameter nozzle used in the aforesaid second and fourth nozzles 7 and 9 will be described with reference to FIGS. 6 and 7. A prismatic coating nozzle 12 is formed with adhesive supply passages 74A and 74B having a circular section, which are in turn formed at their tips with a communication groove 75 which is narrower than the diameter of the passages 74A and 74B. This prevents generally oval shaped adhesive from being coated on the wiring substrate 68 in the case where when the diameter of the supply passages 74A and 74B increases, the width of the communication groove likewise increases. If such an oval shape is employed, when the electronic part 73 is placed on the adhesive, the adhesive is spread, and the adhesive is stuck to the connection lands 71 and 71, which obstructs soldering effected later. The above-described arrangement prevents occurrence of such a situation.

An auxiliary supply channel 76, which is smaller in diameter than that of the supply channels 74A and 74B and has about the same dimension as the width of the communication groove 75 can be formed in the intermediate position of the communication groove 75 whereby positively preventing the occurrence of the situation not to form the bridge portion 72C of the adhesive 72 generated if the width of the communication groove 75 is excessively narrow.

While in the above-described embodiment of the present invention, the leaving portions of the coating nozzles 6, 7, 8 and 9 were marginal portions 4D and 5D of the printed substrates 4 and 5, it is to be noted that the leaving can be made at suitable locations other than the printed substrates 4 and 5.

What is claimed is:

1. An apparatus for coating adhesive for mounting parts onto a plurality of multiphase printed substrates comprising adhesive coating nozzle means arranged in correspondence to the plurality of multiphase printed substrates which are placed on an X-Y table means for effecting coating operations by coating an adhesive onto each of the printed substrates at areas on which the parts are to be mounted, timer means for counting unused time during which said coating nozzle means is unused, means for detecting an identification mark on a substrate plate of the multiphase printed substrates, means for inhibiting the coating operations by said coating nozzles in correspondence to the multiphase printed substrates when said detection means detects said mark, and control means for driving and controlling said coating nozzle means and said X-Y table in response to the passage of a predetermined time-up time counted by said timer means so as to deposit the adhesive onto the multiphase printed substrates at locations other than at said areas on which the parts are to be mounted.

2. An apparatus for coating adhesive for mounting parts onto a printed substrate according to claim 1, wherein a plurality of adhesive supply channels are provided in said coating nozzles, said supply channels being communicated with each other at head ends through a communication groove.

3. An apparatus for coating adhesive for mounting parts onto a printed substrate according to claim I, wherein an advance-notice sensor which detects that the residual of the adhesive has reduced to a predetermined amount, and informing means which effect informing according to detection by said advance-notice sensor are provided on said coating nozzles.

4. An apparatus for coating adhesives for mounting parts onto a plurality of multiphase printed substrates, comprising a coating nozzle means arranged in correspondence to the multiphase printed substrates which are placed on an X-Y table for effecting coating operations by coating an adhesive onto the multiphase printed substrates at areas to be mounted by the parts, memory means for storing information indicative of locations on marginal portions of the multiphase printed substrates that are away from the areas to be mounted by the parts, means for detecting an identification mark on a substrate plate of the multiphase printed substrates, means for inhibiting the coating operation by said coating nozzle means in correspondence to said multiphase printed substrates when said detection means detects the identification mark, timer means for counting unused time during which said coating nozzle means is unused, and control means for driving and controlling said coating nozzle means and said X-Y table in response to the passage of a pre-determined time-up time counted by said timer means so as to deposit the adhesive onto the marginal portions of the multiphase printed substrates in accordance with the information stored by said memory means before effecting the coating operations.

5. An apparatus according to claim 4, further comprising:
means for detecting when a residual amount of said adhesive in an adhesive storage tank is at a predetermined level.

6. An apparatus according to claim 4, wherein said coating nozzle has a body defining adhesive supply passages therein with a circular cross-section, said coating nozzle having a groove in communication with said passages, said groove being narrower than each of the diameters of said passages so as to prevent said adhesive from having a generally oval shape when being coated onto said substrate.

7. An apparatus for coating adhesive for mounting parts onto a printed substrate, comprising a plurality of coating nozzles arranged in correspondence to the printed substrate which is placed on an X-Y table, means for operating each of said coating nozzles to effect coating operations by coating an adhesive onto the printed substrate, memory means for storing information indicative of locations on marginal portions of the printed substrate that are away from the areas on which the parts are to be mounted, timer means provided in correspondence to said coating nozzles, respectively, for counting unused time during which respective coating nozzles are unused, and control means for driving and controlling said coating nozzles and said X-Y table in response to the passage of a pre-determined time-up time counted by said timer means so as to deposit the adhesive onto the marginal portions of the printed substrate in accordance with the information stored by said memory means before effecting the coating operations.

8. An apparatus according to claim 7, further comprising:
means for detecting when residual amounts of said adhesive in respective adhesive storage tanks are at predetermined levels.

9. An apparatus according to claim 7, wherein said coating nozzle has a body defining adhesive supply passages therein with a circular cross-section said coating nozzle having a groove in communication with said passages, said groove being narrower than each of the diameters of said passages so as to prevent said adhesive from having a generally oval shape when being coated onto said substrate.

10. An apparatus for coating adhesive onto a substrate, comprising:
an adhesive coating nozzle;

means for coating an adhesive from said adhesive coating nozzle onto areas of the substrate to be mounted with parts, said coating means including an adhesive coating nozzle memory means for storing information indicative of locations on marginal portions of said substrate that are away from the areas on which the parts are to be mounted; and means for depositing the adhesive from said adhesive coating nozzle onto the marginal portions before effecting said coating operation in accordance with the information stored by said memory means.

11. An apparatus according to claim 10, further comprising:
a plurality of adhesive coating nozzles, said coating means including means for selecting each of said adhesive coating nozzles to coat the substrate with adhesive from respective adhesive storage tanks.

12. An apparatus according to claim 10, further comprising:
means for detecting a defective mark on the substrate; and
means responsive to a detection of said defective mark by said detecting means for preventing said coating operation from taking place on the substrate with the defective mark.

13. An apparatus according to claim 10, further comprising:
means for detecting when a residual amount of the adhesive is at a predetermined level in an adhesive storage tank.

14. An apparatus according to claim 13, further comprising:
means for setting frequency of said coating operation in response to a detection by said detecting means of the residual amount of said adhesive in said adhesive storage tank being at said predetermined level.

15. An apparatus according to claim 14, further comprising:
means for terminating said coating operation in response to said coating operation being carried out in accordance with said frequency set by said setting means after said detection by said detecting means.

16. An apparatus according to claim 10, further comprising:
an X-Y table on which the substrate is placed, said depositing means including means for driving and controlling said X-Y table and said coating nozzle.

17. An apparatus according to claim 16, further comprising:
means for counting an amount of time during which said coating nozzle is not being used to effect said coating operations, said driving and controlling means being responsive to said counting means counting up to a predetermined period of time to change a relative position of said coating nozzle over said X-Y table.

18. An apparatus according to claim 10, wherein said coating nozzle has a body defining adhesive supply passages therein with a circular cross-section, said coating nozzle having a groove in communication with said passages, said groove being narrower than each of the diameters of said passages so as to prevent said adhesive from having a generally oval shape when being coated onto said substrate.

* * * * *